(12) United States Patent
Miyoshi

(10) Patent No.: US 6,774,629 B2
(45) Date of Patent: Aug. 10, 2004

(54) SYSTEMS AND METHODS FOR IDENTIFYING PHASES OF WATER AND FAT

(75) Inventor: Mitsuharu Miyoshi, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/247,389

(22) Filed: Sep. 19, 2002

(65) Prior Publication Data

US 2003/0067300 A1 Apr. 10, 2003

(30) Foreign Application Priority Data

Oct. 4, 2001 (JP) ........................................ 2001-308133

(51) Int. Cl.[7] ................................................ G01V 3/00
(52) U.S. Cl. ......................................................... 324/309
(58) Field of Search ................................. 324/300–309

(56) References Cited

U.S. PATENT DOCUMENTS

| | | | |
|---|---|---|---|
| 5,701,074 A | * 12/1997 | Zhu | ........................... 324/307 |
| 5,891,032 A | 4/1999 | Harvey | |
| 5,909,119 A | 6/1999 | Zhang et al. | |
| 6,147,492 A | 11/2000 | Zhang et al. | |
| 6,147,493 A | 11/2000 | Miyoshi | |
| 6,263,228 B1 | 7/2001 | Zhang et al. | |
| 6,265,875 B1 | 7/2001 | Saranathan et al. | |
| 6,404,198 B1 | 6/2002 | Duerk et al. | |
| 6,515,476 B1 | * 2/2003 | Oshio et al. | ................. 324/309 |
| 6,597,172 B2 | * 7/2003 | Miyoshi | ..................... 324/307 |

FOREIGN PATENT DOCUMENTS

JP 120514 * 8/2001

* cited by examiner

Primary Examiner—Christopher W. Fulton
Assistant Examiner—Dixomara Vargas
(74) Attorney, Agent, or Firm—Carl B. Horton, Esq.; Armstrong Teasdale LLP

(57) ABSTRACT

For the purpose of identifying the phases of water and fat in a complex image captured using magnetic resonance, a complex image G1 is divided into a multiplicity of sections; if the phases of water and fat can be identified from a phase histogram of one section Sc, the phases of water and fat are obtained from a phase histogram of the section; if the phases cannot be identified, phase histograms of proximate sections in a predefined range C1 are added; if the phases of water and fat can be identified from the additive phase histogram, the phases of water and fat are obtained from the additive phase histogram; and if the phases cannot be identified, the same processing is repeated with stepwise enlargement of the predefined range.

17 Claims, 10 Drawing Sheets

Phase Histogram of Section Sa

Phase Histogram of Section Sb

G1

Phase Histogram of 1-layered Range B1

Phase Histogram of Section Sc

Phase Histogram of 1-layered Range C1

Phase Histogram of 2-layered Range C2

Phase Histogram of 2-layered Range D2

Gw

Gf

SYSTEMS AND METHODS FOR IDENTIFYING PHASES OF WATER AND FAT

CROSS REFERENCE TO RELATED APPLICATIONS

This application claims the benefit of Japanese Application No. 2001-308133 filed Oct. 4, 2001.

BACKGROUND OF THE INVENTION

The present invention relates to a water/fat phase identifying method, image producing method and magnetic resonance imaging apparatus, and particularly to a water/fat phase identifying method for identifying the phases of water and fat in a complex image captured using magnetic resonance, an image producing method for producing a water image or a fat image, and a magnetic resonance imaging apparatus for suitably implementing these methods.

Japanese Patent Application Laid Open No. 2001-204711 discloses a method involving: capturing a complex image using magnetic resonance with the phase differentiated between water and fat; extracting separate signal regions in the complex image; generating respective phase histograms of the signal regions; and identifying the phases of water and fat based on the phase histograms.

The conventional technique disclosed in Japanese Patent Application Laid Open No. 2001-204711 conducts processing for extracting separate signal regions in a complex image.

The area of the signal region, however, varies because it depends on the image. If the area of the signal region is too small, the number of data points contained in the signal region is too small and the effect of noise becomes significant, whereby a good phase histogram cannot be obtained. On the contrary, if the area of the signal region is too large, the effect of inhomogeneity of the static magnetic field becomes significant, and again, a good phase histogram cannot be obtained. If a good phase histogram cannot be obtained, the phases of water and fat cannot be suitably identified.

SUMMARY OF THE INVENTION

It is therefore an object of the present invention to provide a water/fat phase identifying method capable of suitably identifying the phases of water and fat without conducting the processing of extracting separate signal regions in a complex image, an image producing method for producing a water image or a fat image, and a magnetic resonance imaging apparatus for suitably implementing these methods.

In accordance with its first aspect, the present invention provides a water/fat phase identifying method characterized in comprising: capturing a complex image using magnetic resonance with the phase differentiated between water and fat; dividing said complex image into a multiplicity of sections; generating a phase histogram for each section; determining whether the phases of water and fat can be identified from the phase histogram of a section of interest; if the phases can be identified, obtaining the phases of water and fat in the section of interest from the phase histogram of the section of interest; if the phases cannot be identified, generating an additive phase histogram by adding phase histograms of sections in a predefined range proximate to the section of interest; and obtaining the phases of water and fat in the section of interest from said additive phase histogram.

In the water/fat phase identifying method of the first aspect, a complex image is divided into a multiplicity of sections; if the phases of water and fat can be identified from a phase histogram of a certain section, the phases of water and fat are obtained from the phase histogram of the section; and if the phases cannot be identified, phase histograms of proximate sections in a predefined range are added to obtain the phases of water and fat from an additive phase histogram. Since the area for which a phase histogram is generated is thus automatically changed, the phases of water and fat can be suitably identified.

In accordance with its second aspect, the present invention provides a water/fat phase identifying method characterized in comprising: capturing a complex image using magnetic resonance with the phase differentiated between water and fat; dividing said complex image into a multiplicity of sections; generating a phase histogram for each section; determining whether the phases of water and fat can be identified from the phase histogram of a section of interest; if the phases can be identified, obtaining the phases of water and fat in the section of interest from the phase histogram of the section of interest; if the phases cannot be identified, generating an additive phase histogram by adding phase histograms of sections in a predefined range proximate to the section of interest; determining whether the phases of water and fat can be identified from said additive phase histogram; if the phases can be identified, obtaining the phases of water and fat in the section of interest from said additive phase histogram; and if the phases cannot be identified, repeating the foregoing processing with stepwise enlargement of said predefined range to obtain the phases of water and fat in the section of interest.

In the water/fat phase identifying method of the second aspect, a complex image is divided into a multiplicity of sections; if the phases of water and fat can be identified from a phase histogram of a certain section, the phases of water and fat are obtained from the phase histogram of the section; and if the phases cannot be identified, phase histograms of proximate sections in a predefined range are added; if the phases of water and fat can be identified from the additive phase histogram, the phases of water and fat are obtained from the additive phase histogram; and if the phases cannot be identified, the same processing is repeated with stepwise enlargement of the predefined range. Since the area for which a phase histogram is generated is thus automatically changed, the phases of water and fat can be suitably identified.

In accordance with its third aspect, the present invention provides the water/fat phase identifying method having the aforementioned configuration, characterized in comprising: if the phases cannot be identified even when said predefined range is enlarged to a predefined limit range, terminating said repetition of the processing, and obtaining the phases of water and fat in the section of interest based on phases of water and fat of another section whose phases of water and fat could be obtained.

In the water/fat phase identifying method of the third aspect, the enlargement of the area for which a phase histogram is generated is terminated at a predefined limit range, and the phases of water and fat in a section of interest are obtained based on phases of water and fat of another section whose phases of water and fat could be obtained. This prevents unnecessarily lengthening of the processing time.

In accordance with its fourth aspect, the present invention provides the water/fat phase identifying method having the aforementioned configuration, characterized in that: when enlarged for an i-th (i=1, 2, . . . ) time, said predefined range is an range which has the section of interest surrounded by i layers of other sections.

In the water/fat phase identifying method of the fourth aspect, since the area for which a phase histogram is generated is enlarged so that a section of interest is surrounded by other sections, the section of interest is centered, and any first-order phase shift between the sections can be canceled out.

In accordance with its fifth aspect, the present invention provides a water/fat phase identifying method characterized in comprising: capturing a complex image using magnetic resonance with the phase differentiated between water and fat; dividing said complex image into a multiplicity of sections; generating a phase histogram for each section; determining whether the phases of water and fat can be identified from the phase histogram of a section of interest; if the phases can be identified, obtaining the phases of water and fat in the section of interest from the phase histogram of the section of interest; and if the phases cannot be identified, obtaining the phases of water and fat in the section of interest based on phases of water and fat of a section which lies proximate to the section of interest and whose phases of water and fat could be obtained.

In the water/fat phase identifying method of the fifth aspect, a complex image is divided into a multiplicity of sections; if the phases of water and fat can be identified from a phase histogram of a certain section, the phases of water and fat are obtained from the phase histogram of the section; and if the phases cannot be identified, the phases of water and fat in the section of interest are obtained based on phases of water and fat of another section whose phases of water and fat could be obtained. This reduces the processing time.

In accordance with its sixth aspect, the present invention provides the water/fat phase identifying method having the aforementioned configuration, characterized in that: said complex image is divided to form a grid.

In the water/fat phase identifying method of the sixth aspect, since the complex imaged is automatically divided, no image analysis is needed and the processing time is reduced.

In accordance with its seventh aspect, the present invention provides the water/fat phase identifying method having the aforementioned configuration, characterized in that: said complex image is divided so that from 64 to 4,096 data points are contained in each section.

In the water/fat phase identifying method of the seventh aspect, since the complex image is divided so that from 64 to 4,096 data points are contained in each section, the area for which the phase histogram is generated is never too small or too large.

In accordance with its eighth aspect, the present invention provides an image producing method characterized in comprising: capturing a complex image using magnetic resonance with the phase differentiated by 90° between water and fat; dividing said complex image into a multiplicity of sections; obtaining the phase of water in each section; and acquiring a water image from the real part of the complex image after subtracting from each data point in said complex image the phase of water in the corresponding section.

In the water/fat phase identifying method of the eighth aspect, since, from each data point in a complex image, the phase of water in the corresponding section is subtracted, the phase of water is "0". Therefore, the real part of the complex image after the subtraction provides a water image.

In accordance with its ninth aspect, the present invention provides an image producing method characterized in comprising: capturing a complex image using magnetic resonance with the phase differentiated by 90° between water and fat; dividing said complex image into a multiplicity of sections; obtaining the phase of water in each section; and acquiring a fat image from the imaginary part of the complex image after subtracting from each data point in said complex image the phase of water in the corresponding section.

In the water/fat phase identifying method of the ninth aspect, since, from each data point in a complex image, the phase of water in the corresponding section is subtracted, the phase of fat is "90°". Therefore, the imaginary part of the complex image after the subtraction provides a fat image.

In accordance with its tenth aspect, the present invention provides a magnetic resonance imaging apparatus characterized in comprising: image capturing means for capturing a complex image using magnetic resonance with the phase differentiated between water and fat; histogram calculating means for dividing said complex image into a multiplicity of sections, and generating a phase histogram for each section; first determining means for determining whether the phases of water and fat can be identified from the phase histogram of a section of interest; first phase obtaining means for, if the phases can be identified, obtaining the phases of water and fat in the section of interest from the phase histogram of the section of interest; additive phase histogram generating means for, if the phases cannot be identified, generating an additive phase histogram by adding phase histograms of sections in a predefined range proximate to the section of interest; and second phase obtaining means for obtaining the phases of water and fat from said additive phase histogram.

In the magnetic resonance imaging apparatus of the tenth aspect, the water/fat phase identifying method of the first aspect can be suitably implemented.

In accordance with its eleventh aspect, the present invention provides a magnetic resonance imaging apparatus characterized in comprising: image capturing means for capturing a complex image using magnetic resonance with the phase differentiated between water and fat; histogram calculating means for dividing said complex image into a multiplicity of sections, and generating a phase histogram for each section; first determining means for determining whether the phases of water and fat can be identified from the phase histogram of a section of interest; first phase obtaining means for, if the phases can be identified, obtaining the phases of water and fat in the section of interest from the phase histogram of the section of interest; additive phase histogram generating means for, if the phases cannot be identified, generating an additive phase histogram by adding phase histograms of sections in a predefined range proximate to the section of interest; second determining means for determining whether the phases of water and fat can be identified from said phase histogram; second phase obtaining means for, if the phases can be identified, obtaining the phases of water and fat in the section of interest from said additive phase histogram; and repeating means for, if the phases cannot be identified, repeating the foregoing processing with stepwise enlargement of said predefined range to obtain the phases of water and fat in the section of interest.

In the magnetic resonance imaging apparatus of the eleventh aspect, the water/fat phase identifying method of the second aspect can be suitably implemented.

In accordance with its twelfth aspect, the present invention provides the magnetic resonance imaging apparatus having the aforementioned configuration, characterized in that: if the phases cannot be identified even when said predefined range is enlarged to the limit range, said repeating means terminates said repetition of the processing; and said magnetic resonance imaging apparatus comprises third phase obtaining means for obtaining the phases of water and fat in the section of interest based on phases of water and fat of another section whose phases of water and fat could be obtained.

In the magnetic resonance imaging apparatus of the twelfth aspect, the water/fat phase identifying method of the third aspect can be suitably implemented.

In accordance with its thirteenth aspect, the present invention provides the magnetic resonance imaging apparatus having the aforementioned configuration, characterized in that: when enlarged for an i-th (i=1, 2, . . . ) time, said predefined range is an range which has the section of interest surrounded by i layers of other sections.

In the magnetic resonance imaging apparatus of the thirteenth aspect, the water/fat phase identifying method of the fourth aspect can be suitably implemented.

In accordance with its fourteenth aspect, the present invention provides a magnetic resonance imaging apparatus characterized in comprising: image capturing means for capturing a complex image using magnetic resonance with the phase differentiated between water and fat; histogram calculating means for dividing said complex image into a multiplicity of sections, and generating a phase histogram for each section; first determining means for determining whether the phases of water and fat can be identified from the phase histogram of a section of interest; first phase obtaining means for, if the phases can be identified, obtaining the phases of water and fat in the section of interest from the phase histogram of the section of interest; and third phase obtaining means for, if the phases cannot be identified, obtaining the phases of water and fat in the section of interest based on phases of water and fat of a section which lies proximate to the section of interest and whose phases of water and fat could be obtained.

In the magnetic resonance imaging apparatus of the fourteenth aspect, the water/fat phase identifying method of the fifth aspect can be suitably implemented.

In accordance with its fifteenth aspect, the present invention provides the magnetic resonance imaging apparatus having the aforementioned configuration, characterized in that: said complex image is divided to form a grid.

In the magnetic resonance imaging apparatus of the fifteenth aspect, the water/fat phase identifying method of the sixth aspect can be suitably implemented.

In accordance with its sixteenth aspect, the present invention provides the magnetic resonance imaging apparatus having the aforementioned configuration, characterized in that: said complex image is divided so that 64 or more data points are contained in each section.

In the magnetic resonance imaging apparatus of the sixteenth aspect, the water/fat phase identifying method of the seventh aspect can be suitably implemented.

In accordance with its seventeenth aspect, the present invention provides a magnetic resonance imaging apparatus characterized in comprising: image capturing means for capturing a complex image using magnetic resonance with the phase differentiated by 90° between water and fat; phase obtaining means for dividing said complex image into a multiplicity of sections, and obtaining the phase of water in each section; and water image acquiring means for acquiring a water image from the real part of the complex image after subtracting from each data point in said complex image the phase of water in the corresponding section.

In the magnetic resonance imaging apparatus of the seventeenth aspect, the water/fat phase identifying method of the eighth aspect can be suitably implemented.

In accordance with its eighteenth aspect, the present invention provides a magnetic resonance imaging apparatus characterized in comprising: image capturing means for capturing a complex image using magnetic resonance with the phase differentiated by 90° between water and fat; phase obtaining means for dividing said complex image into a multiplicity of sections, and obtaining the phase of water in each section; and fat image acquiring means for acquiring a fat image from the imaginary part of the complex image after subtracting from each data point in said complex image the phase of water in the corresponding section.

In the magnetic resonance imaging apparatus of the eighteenth aspect, the water/fat phase identifying method of the ninth aspect can be suitably implemented.

According to the water/fat phase identifying method, image producing method and magnetic resonance imaging apparatus of the present invention, the phases of water and fat can be suitably identified without conducting processing of extracting separate signal regions in a complex image, and a water image or a fat image can be produced.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to embodiments shown in the accompanying drawings.

First Embodiment

Figure 1:
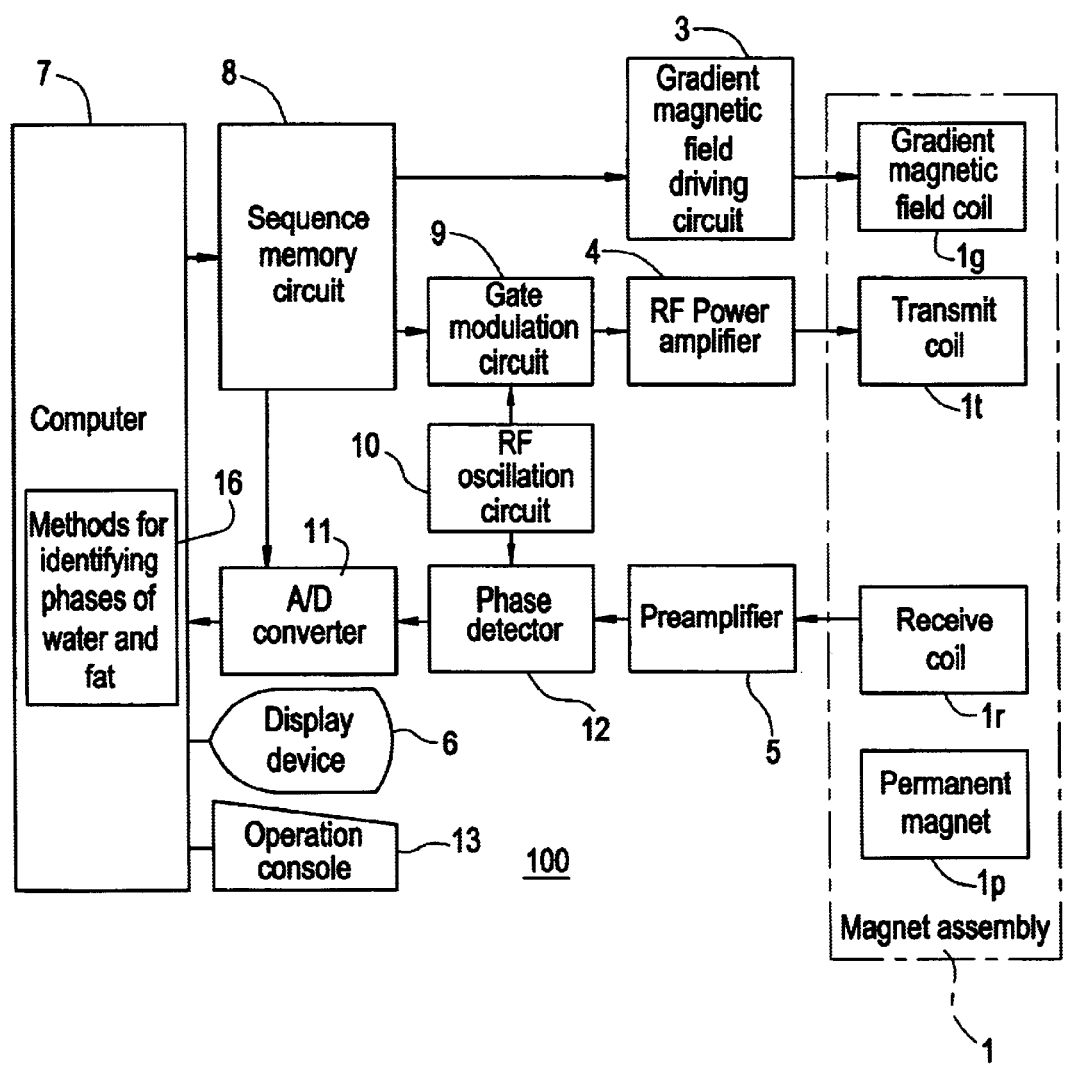
FIG. 1 is a block diagram showing a magnetic resonance imaging apparatus in accordance with an embodiment of the present invention.

FIG. 1 is a block diagram showing a magnetic resonance imaging apparatus in accordance with one embodiment of the present invention.

In the magnetic resonance imaging apparatus 100, a magnet assembly 1 has a cavity portion (bore) for inserting therein a subject, and is provided with a permanent magnet 1p for applying a constant main magnetic field to the subject, a gradient coil 1g for generating X-axis, Y-axis and Z-axis gradient magnetic fields, a transmit coil 1t for supplying RF pulses for exciting spins of atomic nuclei within the subject, and a receive coil 1r for detecting NMR signals from the subject, these components being disposed surrounding the cavity portion. The gradient coil 1g is connected to a gradient magnetic field driving circuit 3. The transmit coil 1t is connected to an RF power amplifier 4. The receive coil 1r is connected to a preamplifier 5.

A sequence memory circuit 8 operates the gradient magnetic field driving circuit 3 based on a stored pulse sequence in response to instructions from a computer 7 to thereby generate gradient magnetic fields from the gradient coil 1g in the magnet assembly 1. The sequence memory circuit 8 also operates a gate modulation circuit 9 to modulate a carrier output signal from an RF oscillation circuit 10 into a pulsed signal of predefined timing and envelope shape. The pulsed signal is applied to the RF power amplifier 4 as an RF pulse signal, power-amplified in the RF power amplifier 4, and then applied to the transmit coil 1t in the magnet assembly 1 to selectively excite a desired region of interest.

The preamplifier 5 amplifies an NMR signal from the subject detected at the receive coil 1r in the magnet assembly 1, and inputs the signal to a phase detector 12. The phase detector 12 phase-detects the NMR signal from the preamplifier 5 employing the carrier output signal from the RF oscillation circuit 10 as a reference signal, and supplies the phase-detected signal to an A/D converter 11. The A/D converter 11 converts the phase-detected analog signal into digital data, and inputs it to the computer 7.

The computer 7 reads the digital data from the A/D converter 11, and performs an image reconstruction operation to produce a complex image of the region of interest. It also produces a water image and a fat image etc. from the complex image. Moreover, the computer 7 is responsible for overall control such as receiving information supplied from an operating console 13. Furthermore, computer 7 generates the complex image and executes methods 16 for identifying phases of water and fat.

The complex image, water image, fat image, etc. are displayed on a display device 6.

Figure 2:
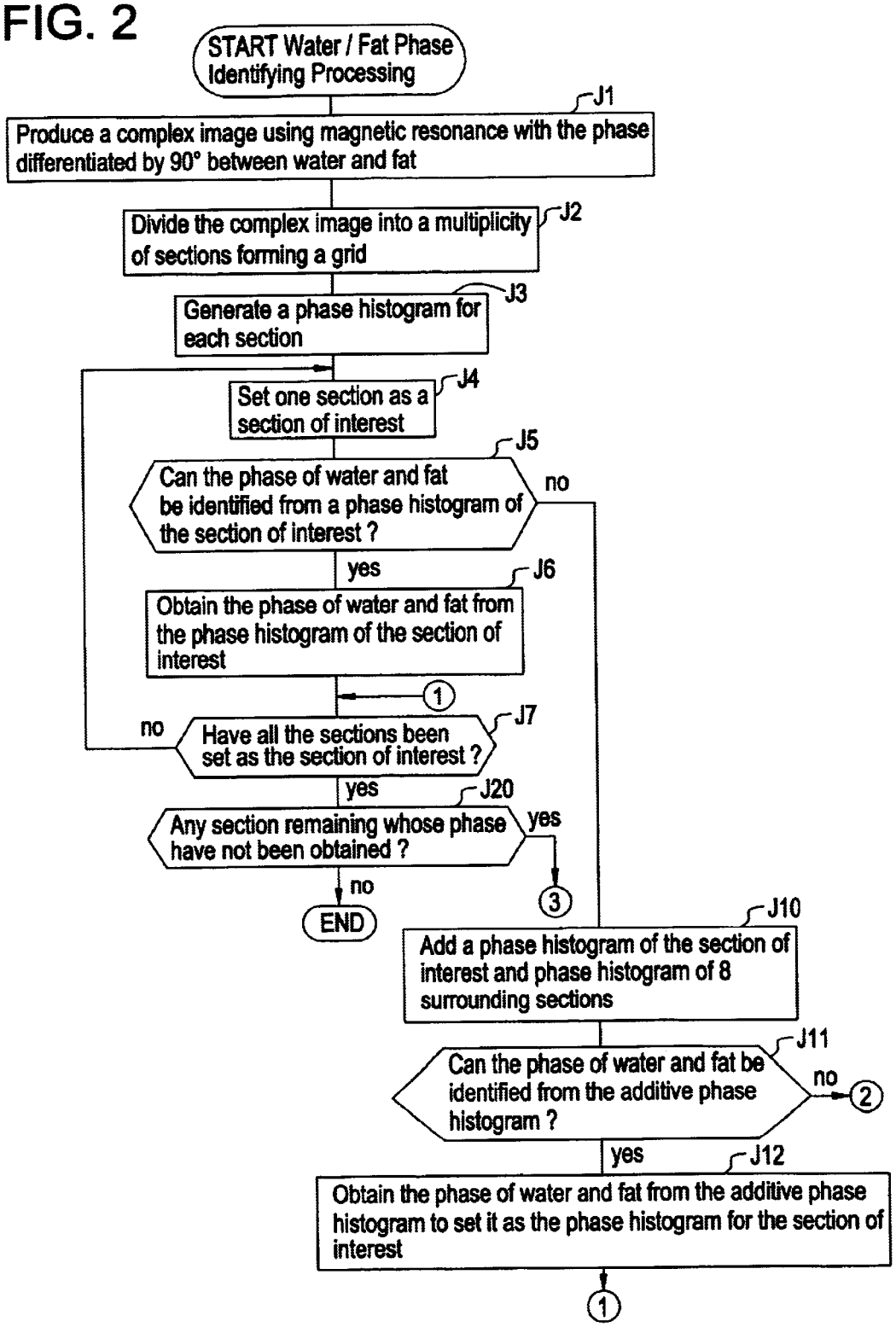
FIG. 2 is a flow chart showing water/fat phase identifying processing in accordance with a first embodiment of the present invention.

FIG. 2 is a flow chart showing water/fat phase identifying processing by the magnetic resonance imaging apparatus 100.

At Step J1, an image is captured using magnetic resonance with the phase differentiated by 90° between water and fat to produce a complex image. Such an imaging process may use, for example, the method described in SMRM 85, Vol. 1, pp. 172–173, Zvi Paltiel and Amir Ban (Elscint MRI Center), or that described in Japanese Patent Application No. 11-177658.

Figure 4:
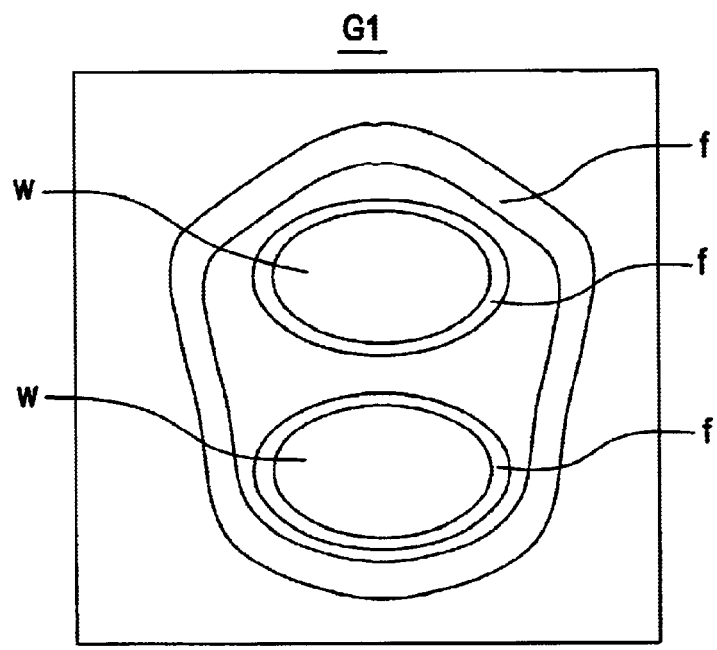
FIG. 4 shows an example of a complex image.

FIG. 4 exemplarily shows a complex image G1. Regions other than a water region w and a fat region f are assumed to be noise regions.

At Step J2, the complex image is divided into a multiplicity of sections forming a grid.

Figure 5:
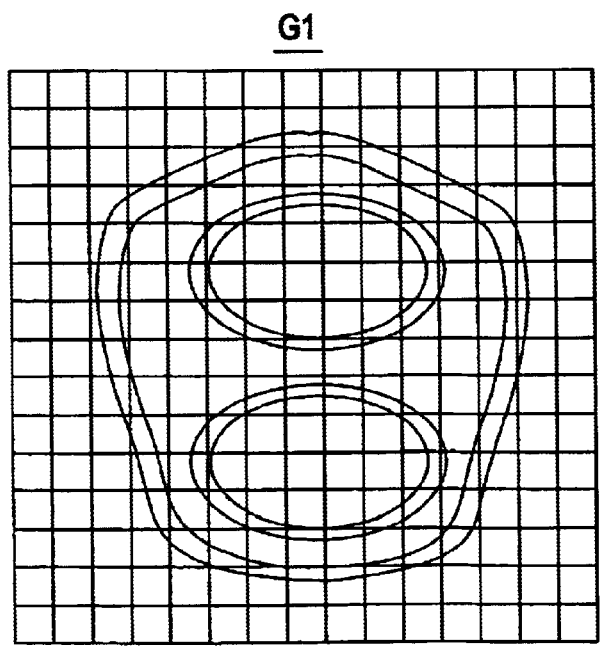
FIG. 5 shows an example of sections obtained by dividing the complex image to form a grid.

FIG. 5 exemplarily shows the complex image G1 divided into a multiplicity of sections forming a grid. For example, a complex image G1 comprised of 256×256 data points divided into 32×32 sections results in 8×8 data points contained in each section.

The division may be finer or coarser. Preferably, the division is conducted so that from 64 to 4,096 data points are contained in each section.

At Step J3, a phase histogram is generated for each section. Specifically, a histogram of the phases for data points contained in each section is generated.

At Step J4, one section is chosen from among sections that have not been set as a section of interest, and the section is set as the section of interest.

At Step J5, determination is made as to whether the phases of water and fat can be identified from the phase histogram of the section of interest, and if it can be identified, the process goes to Step J6; otherwise, to Step J10.

Figure 6:
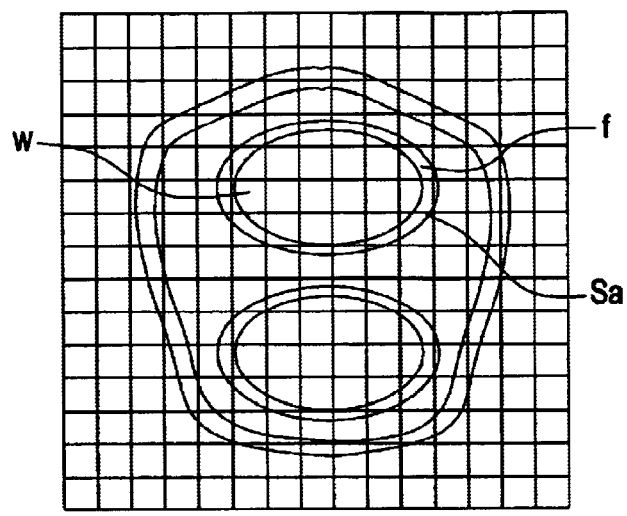
FIG. 6 shows an example of a section whose phases of water and fat can be identified from a phase histogram of the section itself.
Figure 7:
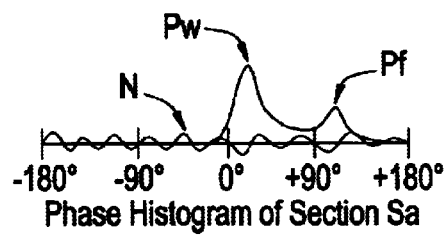
FIG. 7 shows an example of the phase histogram of the section shown in FIG. 6.

For example, a section of interest Sa shown in FIG. 6 contains only a water region w and a fat region f, and the phase histogram of the section of interest Sa has small noise N, as shown in FIG. 7. Thus, since a first peak Pw of the phase of water and a second peak Pf of the phase of fat can be easily obtained, determination that the phases of water and fat can be identified is made.

Figure 8:
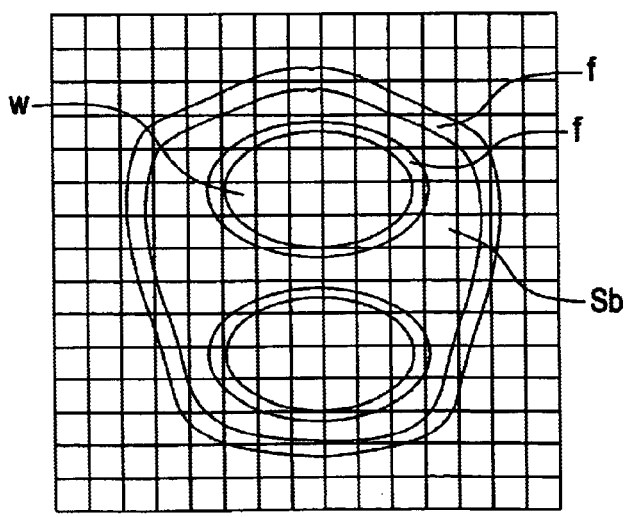
FIG. 8 shows an example of a section whose phases of water and fat cannot be identified from a phase histogram of the section itself.
Figure 9:
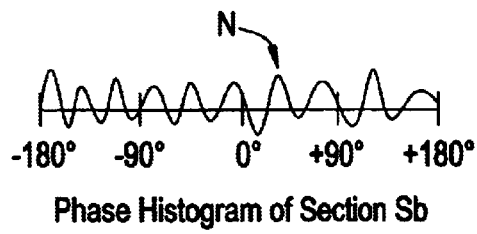
FIG. 9 shows an example of the phase histogram of the section shown in FIG. 8.

On the other hand, a section of interest Sb shown in FIG. 8 contains only a noise region, and the phase histogram of the section of interest Sb has large noise N, as shown in FIG. 9. Thus, since the peak of the phase of water or fat is hard to obtain, determination that the phases of water and fat cannot be identified is made.

Returning to FIG. 2, at Step J6, the phases of water and fat are obtained from the phase histogram of the section of interest. For the example of the phase histogram shown in FIG. 7, the phase of water is 30°, and the phase of fat is 120°.

At Step J7, if there remains any section that has not been set as the section of interest, the process goes back to Step S4; and if all the sections have been set as the section of interest, the process goes to Step J20.

At Step J10, the phase histogram of the section of interest and phase histograms of one layer of eight sections surrounding the section of interest are added to generate an additive phase histogram.

Figure 10:
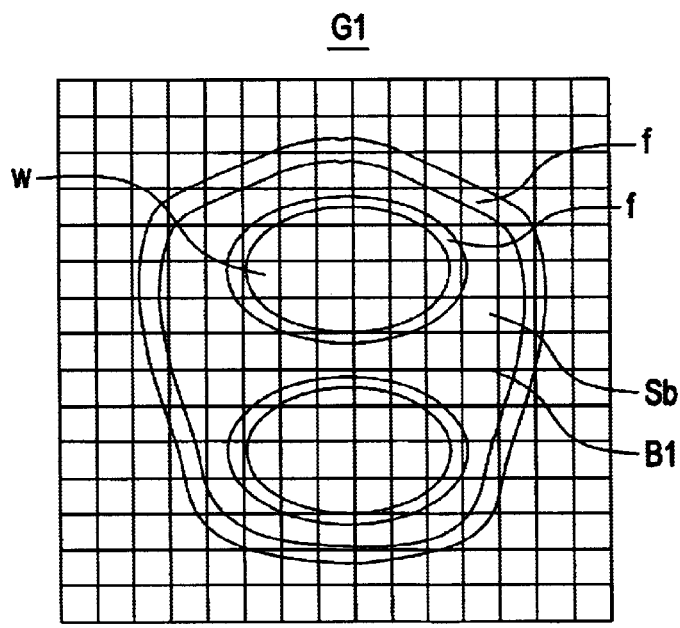
FIG. 10 shows an example of a section whose phases of water and fat can be identified from an additive phase histogram of a one-layered range.

For an example of a section of interest Sb shown in FIG. 10, phase histograms of a one-layered range B1 comprised of nine sections are added to generate the additive phase histogram.

Figure 3:
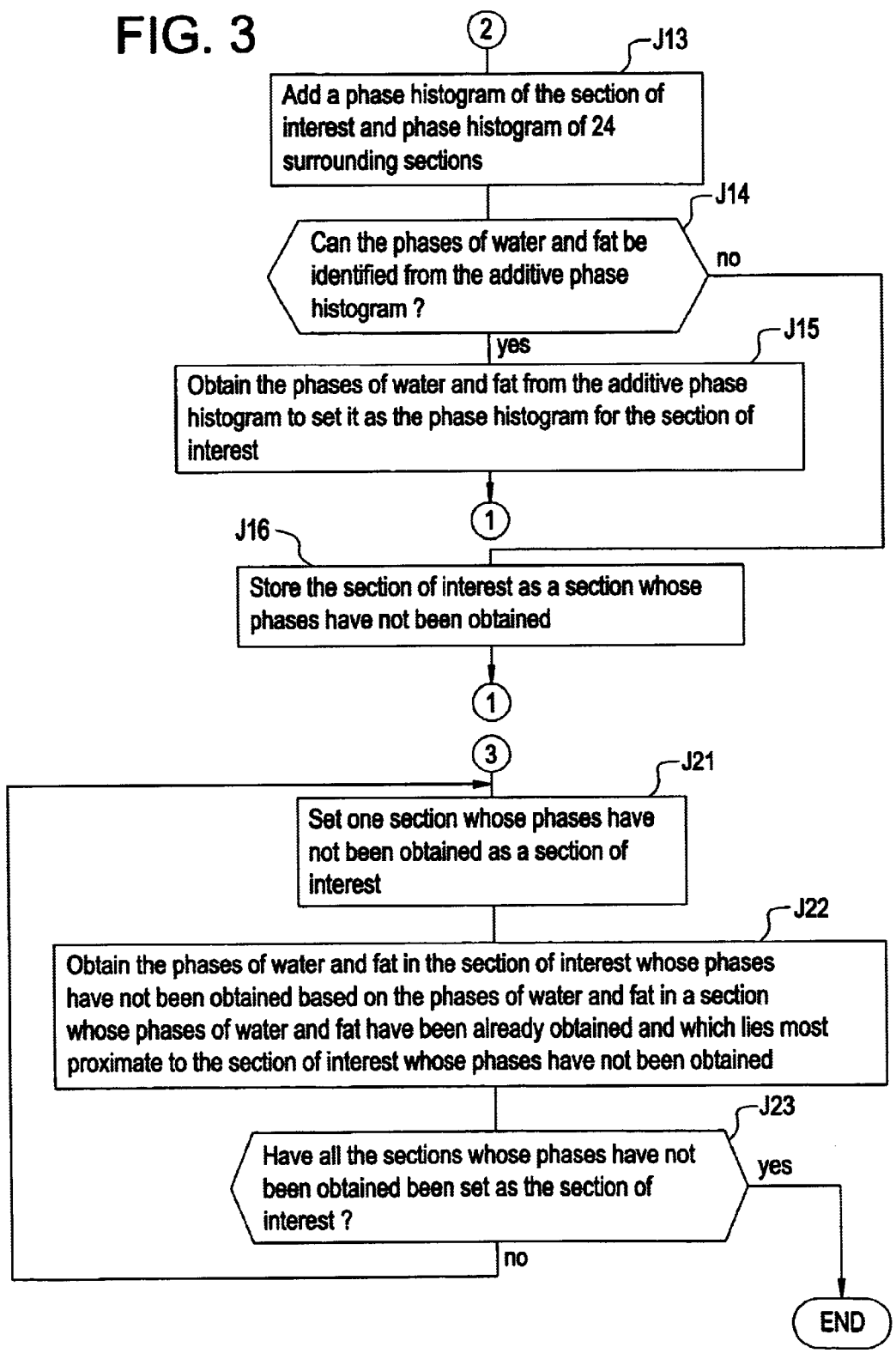
FIG. 3 is a flow chart continued from FIG. 2

At Step J11, determination is made as to whether the phases of water and fat can be identified from the additive phase histogram, and if it can be identified, the process goes to Step J12; otherwise, to Step J13 of FIG. 3.

Figure 11:
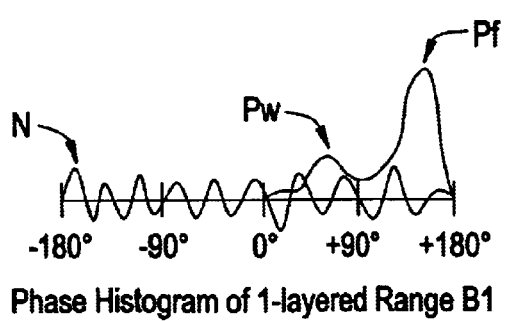
FIG. 11 shows an example of the additive phase histogram of the one-layered range shown in FIG. 10.

For the example of the section of interest Sb shown in FIG. 10, the one-layered range B1 contains a water region w and a fat region f, and the additive phase histogram can provide a first peak Pw of the phase of water and a second peak Pf of the phase of fat, as shown in FIG. 11. Therefore, determination that the phases of water and fat can be identified is made.

Figure 12:
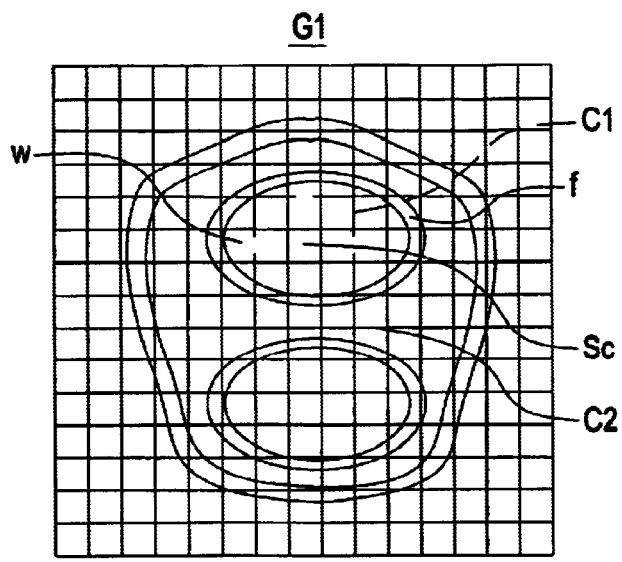
FIG. 12 shows an example of a section whose phases of water and fat can be identified from an additive phase histogram of a two-layered range.
Figure 13:
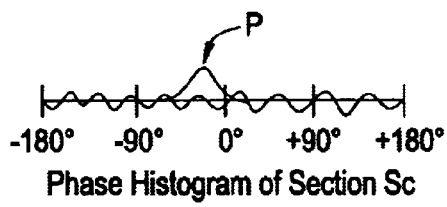
FIG. 13 shows an example of a phase histogram of a section shown in FIG. 12.
Figure 14:
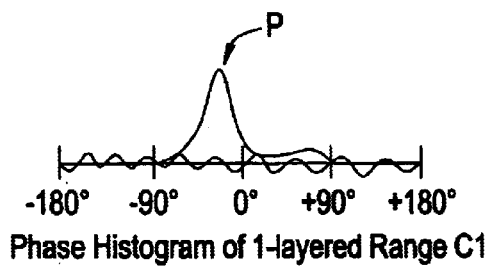
FIG. 14 shows an example of an additive phase histogram of a one-layered range shown in FIG. 12.

On the other hand, a section of interest Sc shown in FIG. 12 contains only a water region w, and its phase histogram has only one peak as shown in FIG. 13. Therefore, identification whether the peak is attributed to water or fat cannot be made. Moreover, since a one-layered range C1 does not contain a sufficient fat region indicated by f, the additive phase histogram has only one peak, as shown in FIG. 14. Therefore, determination that the phases of water and fat cannot be identified is made.

Returning to FIG. 2, at Step J12, the phases of water and fat are obtained from the additive phase histogram. For the example of the additive phase histogram shown in FIG. 11, the phase of water is 60°, and the phase of fat is 150°.

Then, the process goes back to Step J7.

At Step J13 in FIG. 3, the phase histogram of the section of interest and phase histograms of two layers of twenty-four sections surrounding the section of interest are added to generate an additive phase histogram.

For the example of the section of interest Sc shown in FIG. 12, phase histograms of a two-layered range C2 comprised of twenty-five sections are added to generate the additive phase histogram.

At Step J14, determination is made as to whether the phases of water and fat can be identified from the additive phase histogram, and if it can be identified, the process goes to Step J15; otherwise, to Step J16.

Figure 15:
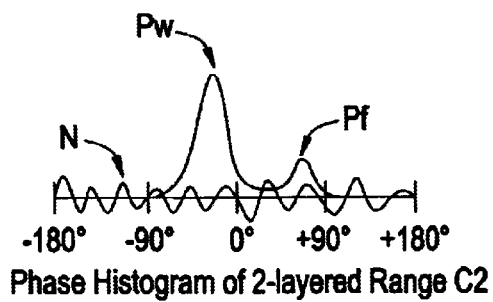
FIG. 15 shows an example of the additive phase histogram of the two-layered range shown in FIG. 12.

For the example of the section of interest Sc shown in FIG. 12, the two-layered range C2 contains a water region w and a fat region f, and the additive phase histogram can provide a first peak Pw of the phase of water and a second peak Pf of the phase of fat, as shown in FIG. 15. Therefore, determination that the phases of water and fat can be identified is made.

Figure 16:
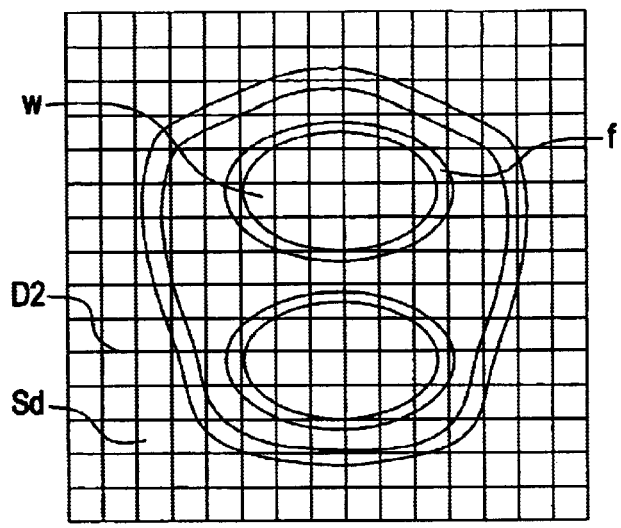
FIG. 16 shows an example of a section whose phases of water and fat cannot be identified even from an additive phase histogram of a two-layered range.
Figure 17:
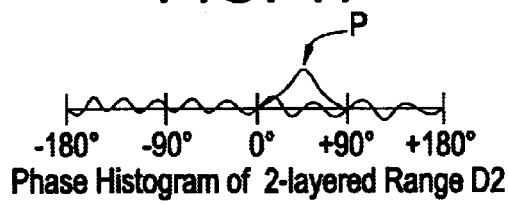
FIG. 17 shows an example of the additive phase histogram of the two-layered range shown in FIG. 16.

On the other hand, a section of interest Sd shown in FIG. 16 contains a fat region f but does not contain a water region w in a two-layered range D2, and its histogram exhibits only one peak as shown in FIG. 17. Therefore, determination that the phases of water and fat cannot be identified is made.

At Step J15, the phases of water and fat are obtained from the additive phase histogram. For the example of the additive phase histogram shown in FIG. 15, the phase of water is −30°, and the phase of fat is 60°.

Then, the process goes back to Step J7.

At Step J16, the section of interest is stored as a section whose phases have not been obtained, and the process goes back to Step J7.

At Step J20 in FIG. 2, if no section whose phases have not been obtained is stored, the process is terminated; otherwise, goes to step J21 in FIG. 13.

At Step J21 in FIG. 3, one section is chosen from among sections whose phases have not been obtained and which have not been set as a section of interest now, and the section is set as a section of interest whose phases have not been obtained.

At Step J22, the phases of water and fat of the section of interest whose phases have not been obtained are determined based on the phases of water and fat in a section whose phases of water and fat have been already obtained and which lies most proximate to the section of interest whose phases have not been obtained.

Figure 18:
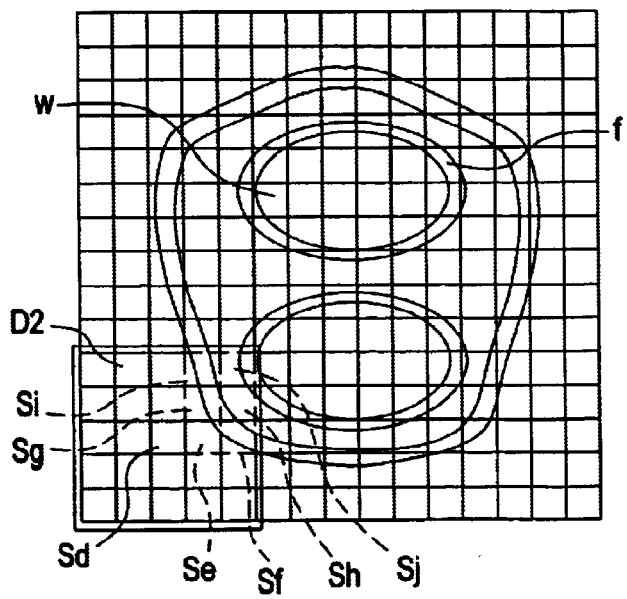
FIG. 18 shows an example of proximate sections for use in identifying the phases of water and fat in a section whose phases have not been obtained.

For example, as shown in FIG. 18, the phases of waters and fat in a section of interest Sd whose phases have not been obtained is determined by averaging the phases of water and fat in sections Se-Sj which lie within the two-layered range D2 for the section of interest Sd whose phases of water and fat has been obtained.

At Step J23, if no section whose phases have not been obtained and which has not been set as the section of interest is left, the process is terminated; otherwise, goes back to Step J21.

While the range (B1, C1, C2) is isotropically enlarged in the preceding description, the range may be anisotropically enlarged. For example, if static magnetic field inhomogeneity is istropic, the range is preferably enlarged isotropically; and if the static magnetic field inhomogeneity is anistropic, the range is preferably enlarged anistropically (i.e., enlarged more in a direction in which the static magnetic field inhomogeneity is larger).

Figure 19:
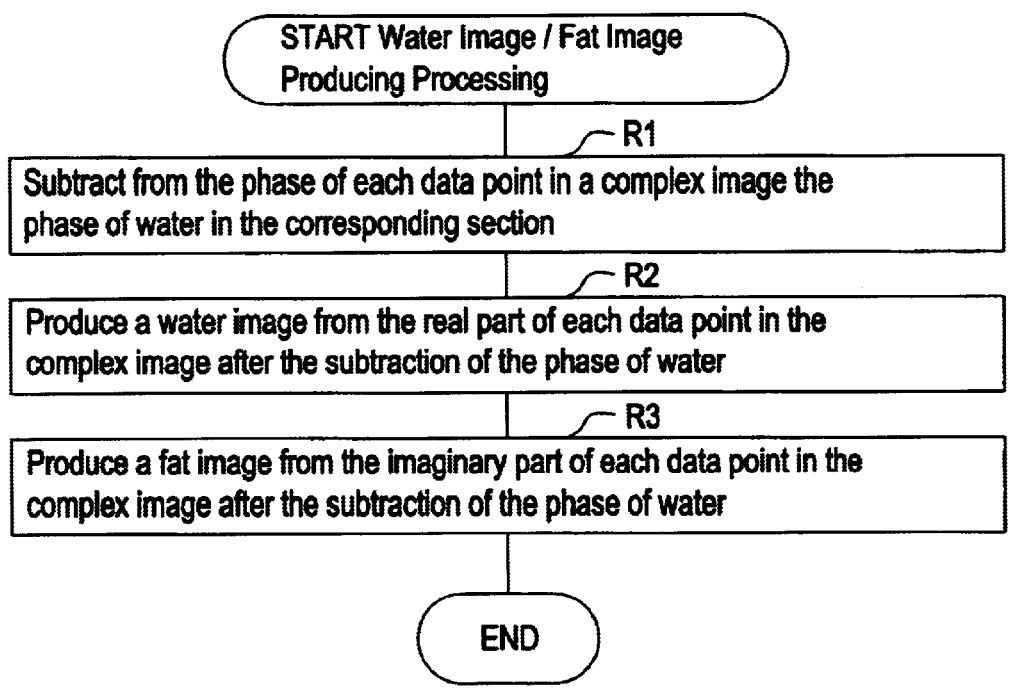
FIG. 19 is a flow chart showing water image/fat image producing processing in accordance with one embodiment of the present invention.

FIG. 19 is a flow chart showing water image/fat image producing processing conducted by the magnetic resonance imaging apparatus 100.

At Step R1, from the phase of each data point in a complex image, the phase of water in the corresponding section is subtracted.

At Step R2, a water image is produced from the real part of each data point in the complex image after the subtraction of the phase of water.

At Step R3, a fat image is produced from the imaginary part of each data point in the complex image after the subtraction of the phase of water.

Then, the processing is terminated.

Figure 20A:
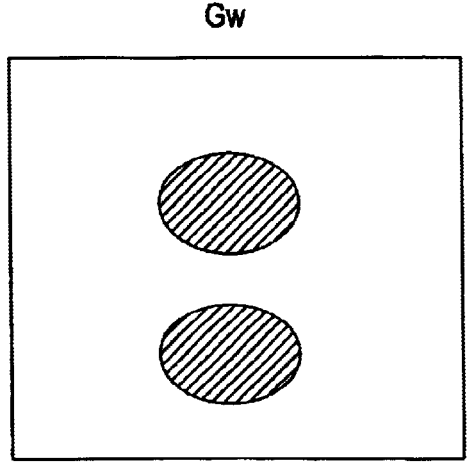
FIG. 20 shows examples of water and fat images.
Figure 20B:
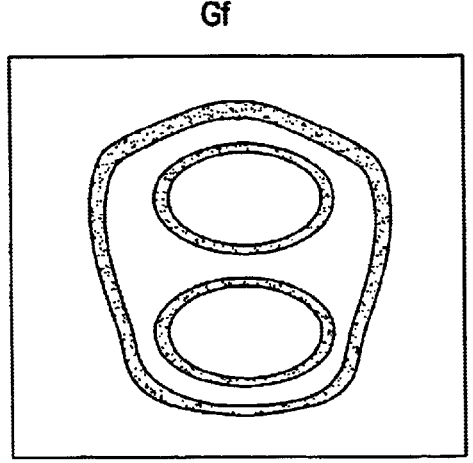

FIG. 20(a) exemplarily shows a water image Gw produced from the complex image G1. FIG. 20(b) exemplarily shows a fat image Gf produced from the complex image G1.

Second Embodiment

The second embodiment is a simplified version of the first embodiment.

Figure 21:
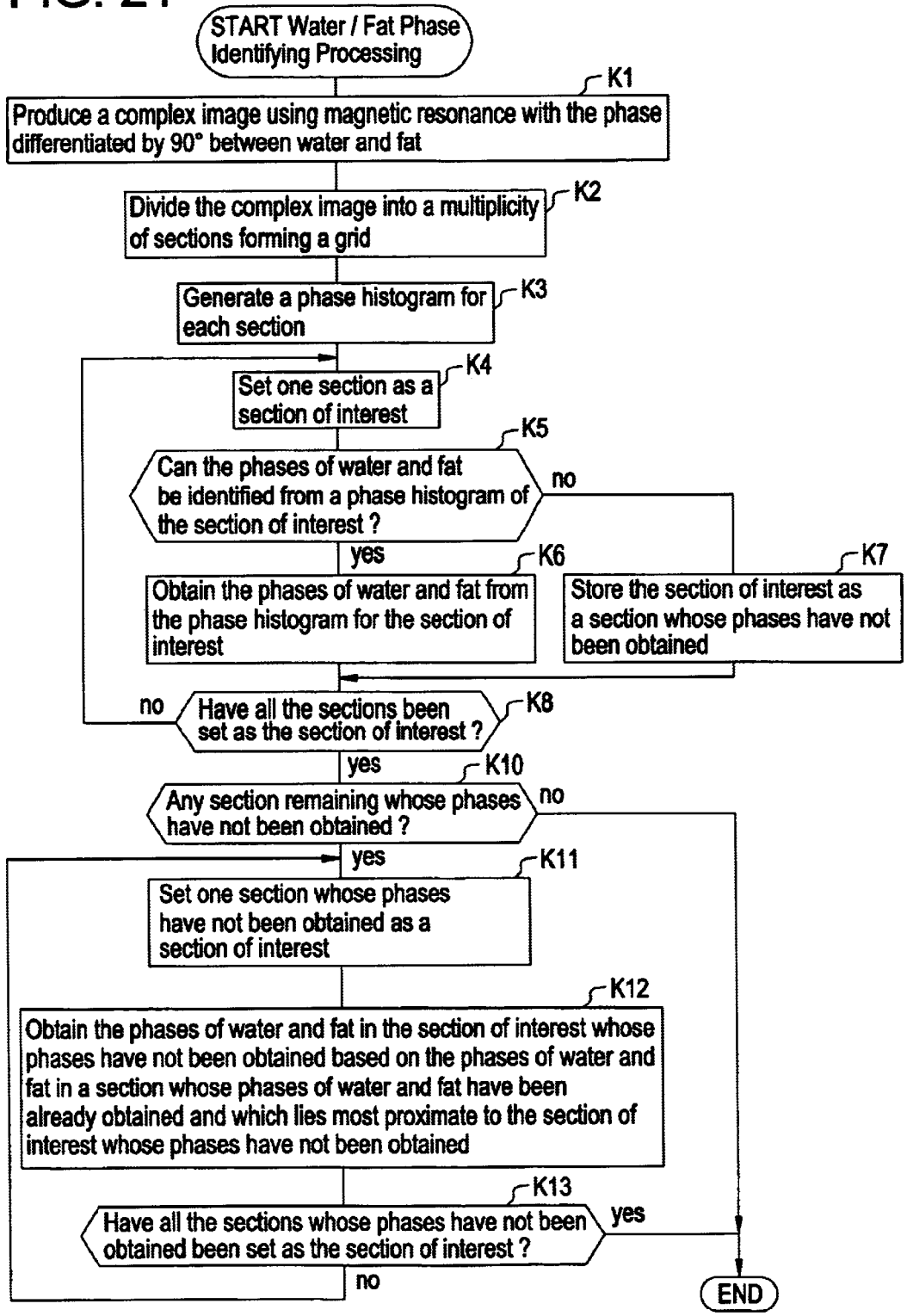
FIG. 21 is a flow chart showing water/fat phase identifying processing in accordance with a second embodiment of the present invention.

FIG. 21 is a flow chart showing water/fat phase identifying processing in accordance with the second embodiment.

At Step K1, an image is captured using magnetic resonance with the phase differentiated by 90° between water and fat to produce a complex image.

At Step K2, the complex image is divided into a multiplicity of sections forming a grid.

At Step K3, a phase histogram is generated for each section.

At Step K4, one section is chosen from among sections that have not been set as a section of interest, and the section is set as the section of interest.

At Step K5, determination is made as to whether the phases of water and fat can be identified from the phase histogram of the section of interest, and if it can be identified, the process goes to Step K6; otherwise, to Step K7.

At Step K6, the phases of water and fat are obtained from the phase histogram of the section of interest. Then, the process goes to Step K8.

At Step K7, the section of interest is stored as a section whose phases have not been obtained, and the process goes to Step K8.

At Step K8, if there remains any section that has not been set as the section of interest, the process goes back to Step K4; and if all the sections have been set as the section of interest, the process goes to Step K10.

At Step K10, if no section whose phases have not been obtained is stored, the process is terminated; otherwise, goes to Step K11.

At Step K11, one section is chosen from among sections whose phases have not been obtained and which have not been set as a section of interest now, and the section is set as a section of interest whose phases have not been obtained.

At Step K12, the phases of water and fat of the section of interest whose phases have not been obtained are determined based on the phases of water and fat in a section whose phases of water and fat have been already obtained and which lies most proximate to the section of interest whose phases have not been obtained.

At Step K13, if no section whose phases have not been obtained and which has not been set as the section of interest is left, the process is terminated; otherwise, goes back to Step K11.

Many widely different embodiments of the invention may be constructed without departing from the spirit and the scope of the present invention. It should be understood that the present invention is not limited to the specific embodiments described in the specification, except as defined in the appended claims.

What is claimed is:

1. A magnetic resonance imaging apparatus comprising:
    an image capturing device for capturing a complex image using magnetic resonance;
    a histogram calculating device for dividing said complex image into a multiplicity of sections, and generating a phase histogram for each section;
    a first determining device for determining whether phases of water and fat can be identified from the phase histogram of a section of interest;
    a first phase obtaining device for obtaining the phases of water and fat in the section of interest from the phase histogram of the section of interest, wherein said first phase obtaining device is configured to obtain the phases of water and fat if it is determined by said first determining device that the phases of water and fat can be identified;
    an additive phase histogram generating device for generating an additive phase histogram by adding phase histograms of at least two of the sections lying within a predefined range proximate to the section of interest, wherein said additive phase histogram generating device is configured to generate the additive phase histogram if it is determined by said first determining device that the phases of water and fat cannot be identified; and
    a second phase obtaining device for obtaining the phases of water and fat from said additive phase histogram.

2. The magnetic resonance imaging apparatus of claim 1, wherein said complex image is divided by a grid.

3. The magnetic resonance imaging apparatus of claim 1, wherein at least 64 data points are contained in each of the sections.

4. The magnetic resonance imaging apparatus of claim 1 further comprising a magnet for applying a static magnetic field across the water and fat, wherein said predefined range is enlarged isotropically if the static magnetic field is isotropic.

5. The magnetic resonance imaging apparatus of claim 1 further comprising a magnet for applying a static magnetic field across the water and fat, wherein said predefined range is enlarged anisotropically if the static magnetic field is anisotropic.

6. A magnetic resonance imaging apparatus comprising:
    an image capturing device for capturing a complex image using magnetic resonance;
    a histogram calculating device for dividing said complex image into a multiplicity of sections, and generating a phase histogram for each section;
    a first determining device for determining whether phases of water and fat can be identified from the phase histogram of a section of interest:
    a first phase obtaining device for obtaining the phases of water and fat in the section of interest from the phase histogram of the section of interest, wherein said first phase obtaining device is configured to obtain the phases of water and fat if it is determined by said first determining device that the phases of water and fat can be identified;
    an additive phase histogram generating device for generating an additive phase histogram by adding phase histograms of at least two of the sections living within a predefined range proximate to the section of interest, wherein said additive phase histogram generating device is configured to generate the additive phase histogram if it is determined by said first determining device that the phases of water and fat cannot be identified;
    a second determining device for determining whether the phases of water and fat can be identified from said additive phase histogram;
    a second phase obtaining device for obtaining the phases of water and fat in the section of interest from said additive phase histogram, wherein said second phase obtaining device is configured to obtain the phases of water and fat if it is determined by said second determining device that the phases of water and fat can be identified; and
    a repeating device for repeating the generating performed by said additive phase histogram generating device, the determining performed by said second determining device, and the obtaining performed by said second phase obtaining device, wherein said repeating device is configured to repeat with a stepwise enlargement of said predefined range to obtain the phases of water and fat in the section of interest, and said repeating device is configured to repeat if it is determined by said second determining device that the phases of water and fat cannot be identified.

7. The magnetic resonance imaging apparatus of claim 6, wherein if the phases cannot be identified even when said predefined range is enlarged to a limit range, said repeating device terminates the repeating and said magnetic resonance imaging apparatus comprises a third phase obtaining device for obtaining the phases of water and fat in the section of interest based on phases of water and fat of another section whose phases of water and fat can be obtained.

8. The magnetic resonance imaging apparatus of claim 6, wherein, when enlarged for an ith time, said predefined range is a range including at least one of the sections, and the at least one of the sections surround the section of interest.

9. The magnetic resonance imaging apparatus of claim 6, wherein said complex image is divided by a grid.

10. The magnetic resonance imaging apparatus of claim 6, wherein at least 64 data points are contained in each of the sections.

11. The magnetic resonance imaging apparatus of claim 6 further comprising a magnet for applying a static magnetic field across the water and fat, wherein said predefined range is enlarged isotropically if the static magnetic field is isotrpic.

12. The magnetic resonance imaging apparatus of claim 6 further comprising a magnet for applying a static magnetic field across the water and fat, wherein said predefined range is enlarged anisotropically if the static magnetic field is anisotropic.

13. A magnetic resonance imaging apparatus comprising:

an image capturing device for capturing a complex image using magnetic resonance;

a histogram calculating device for dividing said complex image into a multiplicity of sections, and generating a phase histogram for each section;

a first determining device for determining whether phases of water and fat can be identified from the phase histogram of a section of interest:

a first phase obtaining device for obtaining the phases of water and fat in the section of interest from the phase histogram of the section of interest, wherein said first phase obtaining device is configured to obtain the phases of water and fat if it is determined by said first determining device that the phases of water and fat can be identified; and a second phase obtaining device for obtaining the phases of water and fat in the section of interest based on phases of water and fat of one of the sections, wherein the one of the sections lies within a predefined range of the section of interest and lies proximate to the section of interest, phases of the one of the sections can be obtained, and said second phase obtaining device is configured to obtain if it is determined by said first determining device that the phases of water and fat cannot be identified.

14. The magnetic resonance imaging apparatus of claim 13, wherein said complex image is divided by a grid.

15. The magnetic resonance imaging apparatus of claim 13, wherein at least 64 data points are contained in each of the sections.

16. The magnetic resonance imaging apparatus of claim 13 further comprising a magnet for applying a static magnetic field across the water and fat, wherein said predefined range is enlarged isotropically if the static magnetic field is isotropic.

17. The magnetic resonance imaging apparatus of claim 13 further comprising a magnet for applying a static magnetic field across the water and fat, wherein said predefined range is enlarged anisotropically if the static magnetic field is anisotropic.

* * * * *

UNITED STATES PATENT AND TRADEMARK OFFICE
CERTIFICATE OF CORRECTION

PATENT NO. : 6,774,629 B2  Page 1 of 1
DATED : August 10, 2004
INVENTOR(S) : Mitsuharu Miyoshi It is certified that error appears in the above-identified patent and that said Letters Patent is hereby corrected as shown below:

<u>Column 12,</u>
Line 19, delete "living" and insert -- lying --.
Line 67, delete "isotrpic" and insert -- isotropic --.

Signed and Sealed this

Second Day of May, 2006

JON W. DUDAS
*Director of the United States Patent and Trademark Office*